United States Patent
Satheesh et al.

(10) Patent No.: US 10,299,060 B2
(45) Date of Patent: May 21, 2019

(54) DETERMINING DISTANCES AND ANGLES BETWEEN SPEAKERS AND OTHER HOME THEATER COMPONENTS

(71) Applicant: Caavo Inc, Milpitas, CA (US)

(72) Inventors: Sharath Hariharpur Satheesh, Bangalore (IN); Ashish D. Aggarwal, Stevenson Ranch, CA (US); Siddharth Kumar, Bangalore (IN)

(73) Assignee: Caavo Inc, Milpitas, CA (US)

( * ) Notice: Subject to any disclaimer, the term of this patent is extended or adjusted under 35 U.S.C. 154(b) by 0 days.

(21) Appl. No.: 15/857,218

(22) Filed: Dec. 28, 2017

(65) Prior Publication Data

US 2018/0192223 A1 Jul. 5, 2018

(30) Foreign Application Priority Data

Dec. 30, 2016 (IN) .............................. 201641044976

(51) Int. Cl.
| | |
|---|---|
| *H04S 7/00* | (2006.01) |
| *H03G 5/16* | (2006.01) |
| *H04R 5/02* | (2006.01) |
| *H04S 3/00* | (2006.01) |
| *H04R 5/04* | (2006.01) |

(52) U.S. Cl.
CPC ............. *H04S 7/301* (2013.01); *H03G 5/165* (2013.01); *H04S 7/305* (2013.01); *H04R 5/02* (2013.01); *H04R 5/04* (2013.01); *H04R 2420/07* (2013.01); *H04S 3/008* (2013.01); *H04S 2400/15* (2013.01)

(58) Field of Classification Search
CPC .......... H04S 7/301; H04S 7/305; H04S 3/008; H04S 2400/15; H04S 7/302; H03G 5/165; H04R 5/02; H04R 5/04; H04R 2420/07
See application file for complete search history.

(56) References Cited

U.S. PATENT DOCUMENTS

| | | | | |
|---|---|---|---|---|
| 7,630,501 | B2 * | 12/2009 | Blank | ..................... H04S 7/301 381/300 |
| 9,794,720 | B1 * | 10/2017 | Kadri | ...................... H04S 7/301 |
| 2012/0114137 | A1 * | 5/2012 | Tsurumi | .................. H04S 7/303 381/92 |
| 2015/0016642 | A1 * | 1/2015 | Walsh | ..................... H04S 7/301 381/307 |
| 2015/0139427 | A1 * | 5/2015 | Sakai | ........................ H04S 5/02 381/17 |

(Continued)

*Primary Examiner* — Mohammad K Islam
(74) *Attorney, Agent, or Firm* — Fiala & Weaver P.L.L.C.

(57) ABSTRACT

Methods, systems, and apparatuses are described herein for determining distances and angles between speakers and other home theater components for performance of calibration operations and functions. Distances are determined through timing playback of sweep signals from a reference speaker to the speakers, and also by timing playback the sweep signals between the speakers and a capture device at a desired listening position. Angles between the speakers and other theater components are determined based on the distances, and locations or mappings of the speakers and other theater components are determined from the angles and distances. The locations/mappings are utilized to perform different calibration operations. The calibration operations improve the user audio experience for speakers that are located in non-optimal positions for speaker configurations.

17 Claims, 8 Drawing Sheets

(56) References Cited

U.S. PATENT DOCUMENTS

| | | | |
|---|---|---|---|
| 2016/0142620 A1* | 5/2016 | Sawa | G01S 3/785 |
| | | | 348/143 |
| 2016/0321917 A1* | 11/2016 | Qiu | G08C 23/02 |
| 2017/0026769 A1* | 1/2017 | Patel | H04R 3/12 |
| 2017/0289727 A1* | 10/2017 | Taira | G01H 7/00 |
| 2017/0325045 A1* | 11/2017 | Baek | H04S 1/002 |
| 2018/0091898 A1* | 3/2018 | Yoon | G01S 5/30 |
| 2018/0139560 A1* | 5/2018 | Shi | G06F 3/165 |

* cited by examiner

DETERMINING DISTANCES AND ANGLES BETWEEN SPEAKERS AND OTHER HOME THEATER COMPONENTS

CROSS-REFERENCE TO RELATED APPLICATION(S)

The present application claims priority to Indian Patent Application No. 201641044976, entitled "DETERMINING DISTANCES AND ANGLES BETWEEN SPEAKERS AND OTHER HOME THEATER COMPONENTS," filed on Dec. 30, 2016, the entirety of which is incorporated by reference herein.

BACKGROUND

Technical Field

The subject matter described herein relates to determining distances and angles between speakers and other home theater components.

Description of Related Art

Getting the best audio and video experience in a home theater system depends on the room acoustics, as well as the location of three major components of the home theater system: the display screen, the speakers, and the seating position of the listener. The position of the display screen and the seating position are relatively easier to determine based on visibility angles, design of the living room, and space availability. However, what poses a challenge are the speaker positions and the room acoustics.

Non-optimal speaker location or non-coherent surround sound not only spoils the audio experience, but can also induce fatigue in the listener, and home theater speakers can be present in different combinations. However, for a full surround sound experience, the speakers are in either a 5.1 setup or a 7.1 setup. For each of these combinations, there are recommendations as to where the speakers should be placed. The recommendations include the angle at which each speaker is placed with respect to the seating position, the direction that the speakers face, and also, in some cases, the distance at which they have to be placed with respect to the seating location. However, in certain situations, living rooms may not have the provision to meet some recommendations. In some living rooms, it may not even be possible to have a home theater setup with 5 or 7 speakers, and therefore, the home theater setup has to make do with a lesser number of speakers. In such cases, the surround sound experience degrades.

Most audio/video receivers (AVRs) give the user an option to adjust the parameters of the speaker setup (such as the angles and/or distances). But not every user can figure out these parameters easily, and hence, the user ends up with a non-optimal setup. Invariably, in most of cases, optimal speaker setup requires the visit of a technician or specialist. In spite of these options, even the best AVRs in the market do not tackle the problem of speaker setups having a lesser number of speakers than the mandated 5.1 or 7.1.

Room acoustics also play a significant role in achieving an optimal surround sound experience. Each object in the room (e.g., the walls, the floor, furniture, etc.) has different properties of absorption and reflection. A room with smooth surfaces, such as marble or hardwood flooring, glass doors and windows, etc., would exhibit a lot of reflection. However, a room with carpets, window curtains, sofa cushions, etc., would exhibit a good amount of absorption and less reflection. Living rooms having lots of reflections (e.g., empty living rooms) or with total absorption (thereby, creating an anechoic environment) are extremes of room acoustics, and neither is desirable. The best sounding room is somewhere between the two.

One way to make a listener's living room the best sounding one is to make physical adjustments. Bare minimum changes would include, but are not limited to, installing carpets or rugs on bare floors, installing drapes on smooth walls, glass windows, etc., and/or the like. With some more expense, the walls can be treated by making the surface rough, replacing smooth surfaces (e.g., wooden, glass, or marble surfaces) with less reflective ones, replacing furniture, etc. Typically, before a home theater system installation, these changes are recommended and performed by a home theater system manufacturer/maker. This procedure is generally referred as room tuning. Room tuning is normally done by a professional acoustician who utilizes audio measurement systems. This is an expensive proposition. Alternatively, room tuning can be achieved to a large extent electronically (i.e., digital room tuning). Some of the best home theater speaker systems support digital room tuning, which uses a digital equalizer (EQ). Digital EQs can be simple boosts or attenuations to certain frequencies or can be more elaborate and gather room acoustics to create a cascaded EQ curve that assists with the production of more accurate sound playback.

BRIEF SUMMARY

Methods, systems, and apparatuses are described for determining distances and angles between speakers and other home theater components for performance of calibration operations and functions, substantially as shown in and/or described herein in connection with at least one of the figures, as set forth more completely in the claims. Distances are determined through timing playback of sweep signals from a reference speaker to the speakers, and also by timing playback the sweep signals between the speakers and a capture device at a desired listening position. Angles between the speakers and other theater components are determined based on the distances, and locations or mappings of the speakers and other theater components are determined from the angles and distances. The locations/mappings are utilized to perform different calibration operations. The calibration operations improve the user audio experience for speakers that are located in non-optimal positions for speaker configurations.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Figure 1:
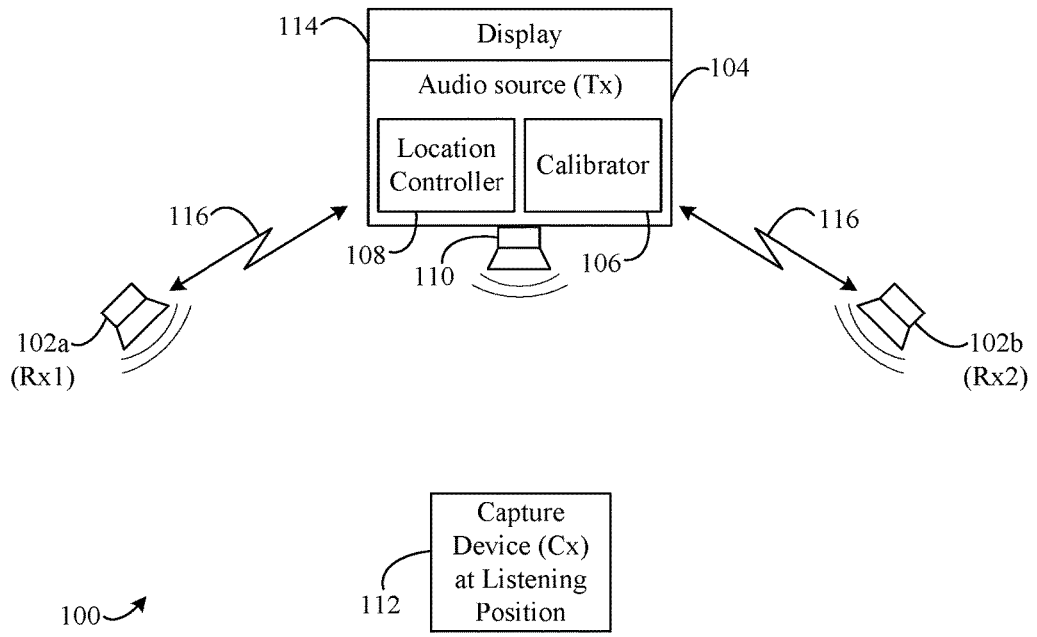
FIG. 1 shows a block diagram of a system for determining distances and angles between speakers and other home theater components and calibrating wireless speakers, according to an example embodiment.

The features and advantages of embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description discloses numerous embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the discussion, unless otherwise stated, adjectives such as "substantially," "approximately," and "about" modifying a condition or relationship characteristic of a feature or features of an embodiment of the disclosure, are understood to mean that the condition or characteristic is defined to be within tolerances that are acceptable for operation of the embodiment for an application for which it is intended.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures and drawings described herein can be spatially arranged in any orientation or manner.

Techniques are described herein that calculate an estimate of the absolute distances between all participating entities in a home theater speaker system (e.g., a wireless audio transmitter/source), two or more wireless receivers (e.g., wireless speakers), each having a microphone, a device configured to capture audio via a microphone (e.g., a phone, a computer, etc.), and/or a display device (e.g., a television, a monitor, a projector and/or the like)), and subsequently deriving angles and/or distances of each wireless receiver with respect to the listening position and the display device. The calculated distances and angles along with the acoustics of the room in which the home theater speaker system is located are used to accurately tune the home theater speaker system for the room.

Some solutions to the above-described problems are described in U.S. Pat. No. 8,588,431, entitled "Electrical System for a Speaker and its Control," the entirety of which is incorporated by reference, where digital room tuning is performed by a home theater system including wireless speakers that provide the flexibility to place the speakers anywhere in the room. The techniques and embodiments described herein provide different approaches to determining distances and angles between speakers and other home theater components, e.g., for performing calibrations. In some embodiments, for example, the techniques described herein extend the techniques described in aforementioned U.S. Pat. No. 8,588,431 and provide an alternative method to determine speaker locations.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

Section II below describes example embodiments for distance and angle determination using systems and methods for the described techniques herein. In particular, Subsection II.A describes example embodiments for first phase distance measurements, Subsection II.B describes example embodiments for second phase distance measurements, Subsection II.C describes example embodiments for angle measurements, Subsection II.D describes example embodiments for resolving left/right speaker ambiguity, and Subsection II.E describes example embodiments for calibration and room equalization.

Section III below describes example mobile device and computing device embodiments that may be used to implement features of the embodiments described herein. Section IV below describes some additional examples and advantages, and Section V provides some concluding remarks.

II. Speaker Distance and Angle Determination

In embodiments, systems and devices may be configured in various ways to determine distances and angles between speakers and other home theater components for performing calibrations.

The systems and methods described below may utilize a wireless audio transmitter/source, two or more wireless receivers/speakers, and a device configured to capture audio and/or playback calibration (e.g., sweep) signal(s). In embodiments, the wireless receivers/speakers may be configured to capture audio rather than such a capture device. The systems and methods may also utilize a display device for viewing video. A display device may include a speaker such as a loudspeaker, mini-speaker, etc., used as a reference speaker and may also be incorporated into the described systems. In some embodiments, instead of a speaker in a display device, the audio transmitter/source may have a co-located speaker used as the reference speaker.

The audio transmitter/source and the receivers/speakers may be synchronized in time as described in in U.S. application Ser. No. 15/354,449, filed on Nov. 17, 2016, and entitled "Multi-Channel Audio Over a Wireless Network," the entirety of which is incorporated by reference.

Figure 2:
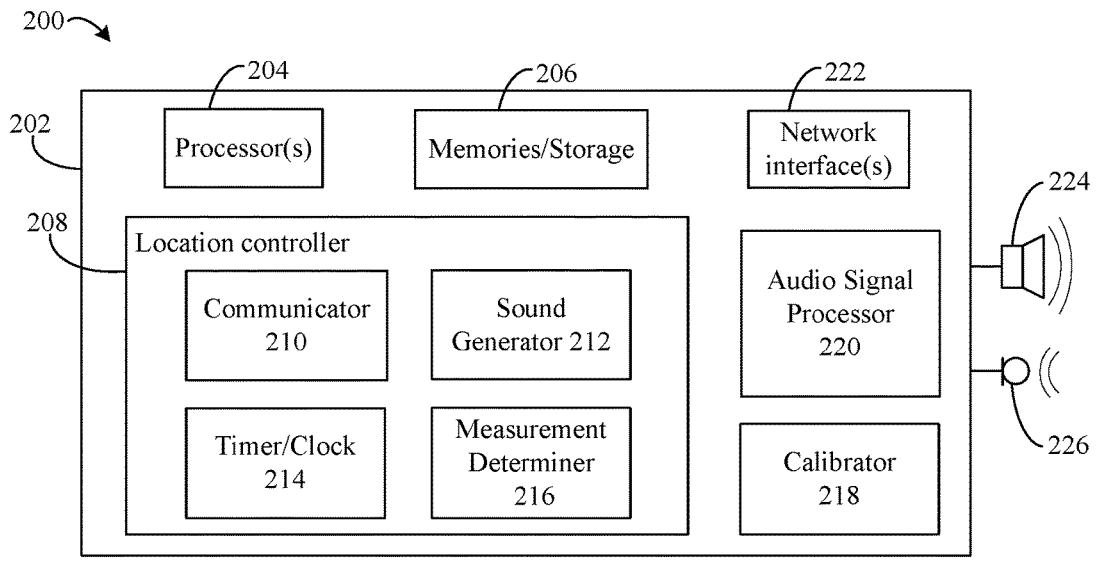
FIG. 2 shows a block diagram of a system for determining distances and angles between speakers and other home theater components and calibrating wireless speakers, according to an example embodiment.

The embodiments and techniques herein provide for improvements in home entertainment, audio system setup, and audio system operation by maximizing audio quality in systems with non-optimal speaker placements. FIGS. 1 and 2 describe example system and device embodiments.

FIG. 1 depicts a system 100 for determining distances and angles between speakers and other home theater components and calibrating wireless speakers, according to embodiments. As shown in FIG. 1, system 100 includes a wireless first speaker 102a (Rx1), a wireless second speaker 102b (Rx2), a wireless audio transmitter/source 104 (Tx), a display device 114, and a device configured to capture audio 112 (Cx) (referred herein as a "capture device").

Wireless audio source 104 may, for example, be a stand-alone device, be coupled to display device 114, or integrated into display device 114. Wireless audio source 104 is configured to transmit wireless audio signals to first speaker 102a and second speaker 102b, which may be wireless speakers, for playback of audio signals. Wireless signals 116 may be transmitted according to any known protocol such as Bluetooth®, Wi-Fi®, IEEE 802.11 protocols, etc. Wireless signals 116 may include audio signals, system state signals (e.g., timing, device identification, device properties, location, etc.), and informational signals related to calibration operations (e.g., times at which sweep signals are received, etc.). In the embodiment shown, wireless audio source 104 includes a calibrator 106 and a location controller 108.

Calibrator 106 is configured to perform various calibration functions for wireless audio source 104 and system 100 (including first speaker 102a (Rx1) and second speaker 102b (Rx2)), such as but without limitation, signal delay adjustments, signal level adjustments, equalization, sound field rotation, etc. Location controller 108 is configured to perform various location functions and calculations to determine distances, angles, and locations of given speakers and components relative to other speakers and components of system 100. Calibrator 106 and location controller 108, along with their respective functionalities, are discussed in further detail below.

Display device 114 may be a television (TV), a monitor, a projector, and/or the like. Display device 114 and/or wireless audio source 104 may include a reference speaker 110 configured to provide audio signal playback, including sweep/calibration signal playback, to the acoustic space (e.g., room) in which system 100 is located as well as to components of system 100.

Capture device 112 may be a remote control device comprising a microphone and a speaker, a computer, a mobile device, such as a telephone (e.g., a smart phone and/or mobile phone), a personal data assistant (PDA), a tablet, a laptop computer, etc., and/or may be any computing device or consumer electronic device equipped with a microphone and a speaker. Capture device 112 is configured to capture audio signals played back by first speaker 102a, second speaker 102b, and reference speaker 110 which may comprise a portion of display device 114 and/or wireless audio source 104. Capture device 112 may be configured to capture audio signals at a desired listening position for a listener (e.g., a chair, couch, etc.) in the acoustic space in which system 100 is located.

It is contemplated that while only two wireless speakers, first speaker 102a (Rx1) and second speaker 102b (Rx2), are shown for the sake of brevity, any number of additional speakers may be included in embodiments of system 100. It is also contemplated that in embodiments any speaker/component of system 100 of FIG. 1 may include a microphone and/or a speaker (e.g., a loudspeaker). For example, first speaker 102a (Rx1) and second speaker 102b (Rx2) may each include a microphone, such as an omnidirectional microphone or microphone array, to receive/capture audio signals from any other speaker/loudspeaker in system 100. The speakers/components of system 100 may be active devices, in some embodiments, and in some embodiments a wired or partially-wired system 100 is also contemplated.

According to embodiments, the speakers/components of system 100 may include various sub-components in various configurations for performing the techniques and embodiments described herein.

For example, FIG. 2 is a block diagram of a system 200 configured for determining distances and angles between speakers and other home theater components and performing calibrations. System 200 may be an embodiment of any speaker/component of system 100 of FIG. 1. System 200 of FIG. 2 will be described in conjunction with the flowchart of FIG. 3 and the system of FIG. 4. System 200 is described as follows.

System 200 may be any type of computing system or audio/video system as mentioned elsewhere herein, or as otherwise known. As shown in FIG. 2, system 200 includes an audio/video (A/V) device 202, which includes one or more of a processor ("processor") 204, one or more of a memory and/or other physical storage device ("memory") 206, a network interface(s) ("network interface") 222, and a location controller 208 which may be an embodiment of location controller 108 of FIG. 1. System 200 also includes a calibrator 218 which may be an embodiment of calibrator 106 of FIG. 1, and an audio signal processor 220.

System 200 may also include additional components (not shown for brevity and illustrative clarity) including, but not limited to, components and subcomponents of other systems herein, as well as those described below with respect to FIGS. 10 and 11, such as an operating system. In embodiments, system 200 may also include fewer components than those shown in FIG. 2.

Processor 204 and memory 206 may respectively be any type of processor circuit or memory that is described herein, and/or as would be understood by a person of skill in the relevant art(s) having the benefit of this disclosure. Processor 204 and memory 206 may each respectively comprise one or more processors or memories, different types of processors or memories, remote processors or memories, and/or distributed processors or memories. Processor 204 comprises circuitry that is configured to execute computer program instructions such as but not limited to program/software embodiments of location controller 208, calibrator 218, and/or audio signal processor 220, which may be implemented as computer program instructions for application session monitoring and control such as program logic for efficient display of data points, etc., as described herein. Memory 206 is configured to store such computer program instructions, as well as to store other information and data described in this disclosure.

Audio signal processor 220 may be any type of signal processor configured to implement various filters and level/channel adjustments described herein. In embodiments, audio signal processor 220 may comprise hardware circuits, executable software, firmware, or any combination thereof. In embodiments, audio signal processor 220 may be implemented in conjunction with, or by, processor 204.

Network interface 222 may be any type of wired and/or wireless network adapter, modem, etc., configured to enable computing system 200 to communicate with other devices over a network, such as communications between system 200 and other devices utilized in an audio/video system such as system 100 of FIG. 1. For example, wireless audio source 104, first speaker 102a, second speaker 102b, and/or capture device 112 may communicate with each other using a wireless protocol such as those described herein.

Speaker 224 may be an embodiment of any speaker in system 100 of FIG. 1, and may be configured as any type of speaker that converts electrical signals into sound, including but without limitation, a loudspeaker, a micro-speaker, a mini-speaker, etc., from any manufacturer. Speaker 224 may be configured as a wireless, or wired, speaker in various embodiments. System 200 may also comprise a wireless speaker (e.g., as shown for first speaker 102a and second speaker 102b in FIG. 1). Speaker 224 may comprise an active or a passive speaker. System 200 as shown also includes a microphone 226 that may be configured as an omnidirectional microphone or a microphone array, to receive/capture audio signals such as sweep/calibration signals from any other speaker/loudspeaker in a system, e.g., as shown in system 100 of FIG. 1). Accordingly, speakers described herein may also include a microphone(s) to receive/capture audio signals.

Calibrator 218 is configured to perform various calibration functions for system 200, such as but without limitation, signal delay adjustments, signal level adjustments, equalization, sound field rotation, etc. Calibrator 218 may utilize measurements and parameters (including mappings) determined by location controller 208 (described in further detail below) to perform one or more of its calibration functions. Calibrator 218 is configured to perform calibration functions for speakers and loudspeakers that may not be ideally placed for acoustic quality (e.g., due to shape, content, and/or available space of the acoustic space). In order to perform calibrations for the best possible quality audio experience given less than ideal speaker placements, the location of system speakers/components determined by location controller 208 are utilized.

Location controller 208 is configured to perform various location functions and calculations to determine distances, angles, and locations of given speakers and components relative to other speakers and components (e.g., as shown in system 100 of FIG. 1). Location controller 208 includes a plurality of components for performing the techniques described herein to determine distances, angles, and locations. As shown, location controller 208 includes a communicator 210, a sound generator 212, a timer/clock 214, and a measurement determiner 216. While shown separately for illustrative clarity, in embodiments, one or more of communicator 210, sound generator 212, timer/clock 214, and measurement determiner 216 may be integrated together and/or as a part of other components of system 200. In some embodiments, less than all of the components of location controller 208 illustrated in FIG. 2 may be included.

Location controller 208 may operate in various ways to perform various location functions and calculations to determine distances, angles, and locations of speakers and components.

Figure 3:
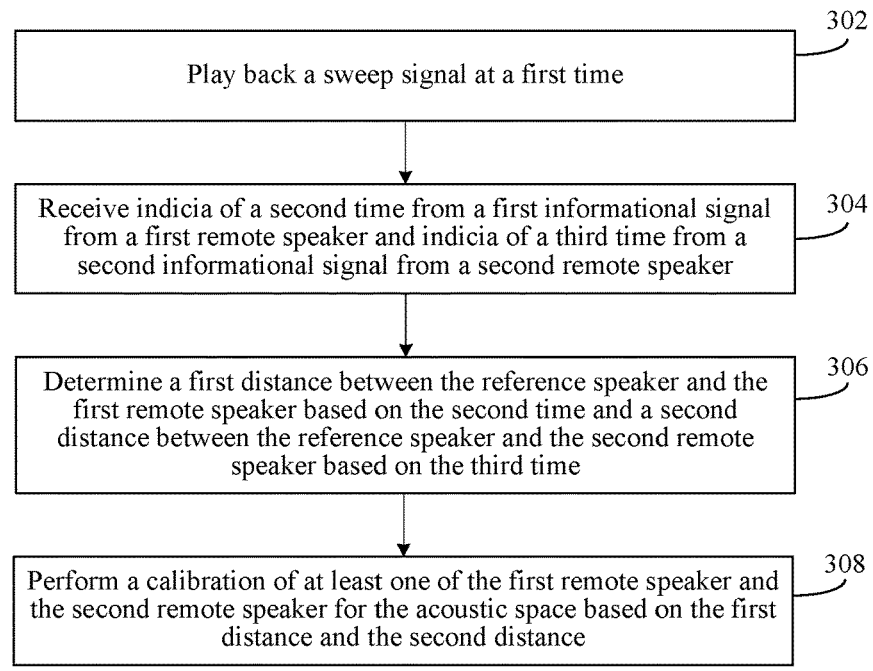
FIG. 3 shows a flowchart for determining distances and angles between speakers and other home theater components and calibrating wireless speakers, according to an example embodiment.

For instance, FIG. 3 shows a flowchart 300 for determining distances and angles between speakers and other home theater components and calibrating wireless speakers, according to an example embodiment. System 200 and location controller 208 may operate according to flowchart 300, in an embodiment. Further structural and operational examples will be apparent to persons skilled in the relevant art(s) based on the following description.

Figure 4:
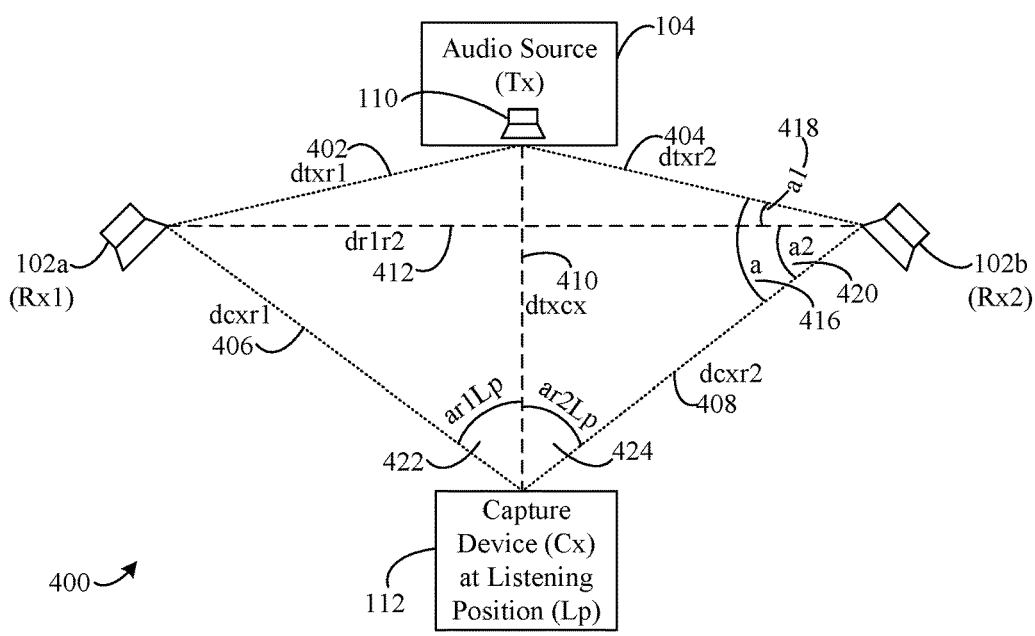
FIG. 4 shows a block diagram of a system for determining distances and angles between speakers and other home theater components and calibrating wireless speakers, according to an example embodiment.

FIG. 4 shows a block diagram of a system 400 for determining distances and angles between speakers and other home theater components and calibrating wireless speakers, according to an example embodiment. System 400 is an embodiment of system 200 of FIG. 2 having distances, angles, and axes between speakers/components shown for illustration. In system 400, one or more components of system 200 may not be shown for the sake of brevity and illustrative clarity. A map of the placement of first speaker 102a and second speaker 102b, e.g., in a room/acoustic space, may be created by measuring the distances between first speaker 102a, second speaker 102b, wireless audio source 104, and/or capture device 112. The measurement of distances may be performed in two phases in some embodiments. The distances between first speaker 102a, second speaker 102b, and/or wireless audio source 104 may be measured during a first phase, and the distances between the listening position (e.g., capture device 112) and first speaker 102a, second speaker 102b, and/or wireless audio source 104, may be measured during a second phase, as described below.

A. Measurement of Distance—Phase 1

Flowchart 300 is described below with respect to system 100 of FIG. 1, system 200 of FIG. 2 and system 400 of FIG. 4.

Flowchart 300 beings with step 302. In step 302, a sweep signal is played back at a first time. That is, a known sweep signal may be played back at a predetermined time instance known to the first speaker and the second speaker. For example, a sweep signal may be played back by speaker 224 of FIG. 2 (while in the context of system 100 of FIG. 1, the sweep signal may be played back by reference speaker 110). When calibration is needed or initiated, e.g., by a user, on detection of new speakers, etc., location controller 208 may receive a calibration command via communicator 210 that causes sound generator 212 to provide a sweep/calibration signal for playback by speaker 224. The frequencies and duration of the sweep signal may be stored in memory 206 and retrieved by sound generator 212 before being provided to speaker 224, e.g., via audio signal processor 220.

The first time may be defined as the time at which speaker 224 begins/ends playback of the sweep signal, and the first time may be tracked and/or determined using timer/clock 214. In embodiments, the first time may be predetermined by location controller 208, and the predetermined first time may be shared with other devices, e.g., speakers to be calibrated, via communicator 210 and network interface 222. The duration and make up/content of the sweep signal may also be predetermined or known. Therefore, each time the sweep signal is played back, its content and duration may be recognized and expected by other components of the system.

In step 304, indicia of a second time from a first informational signal from a first remote speaker and indicia of a third time from a second informational signal from a second remote speaker are received. For instance, location controller 208 is configured to receive a signal with indicia of a second time (corresponding to when first speaker 102a received the played back sweep signal) via network interface 222 and communicator 210. Similarly, location controller 208 is configured to receive a signal with indicia of a third time (corresponding to when second speaker 102b received the played back sweep signal) via network interface 222 and communicator 210. That is, when the sweep signal is played back as in step 302, speakers of the systems described herein are configured to receive the played back sweep signal via microphones, register/save the time when the signal is received (e.g., using timer/clock 214), and then report back the received time, e.g., to location controller 208 for calculations. Thus, both the first speaker and the second wireless speaker in-turn capture the sweep signal. In the context of FIG. 1, the indicia of time may be received by a location controller 208 of audio source 104.

In step 306, a first distance between the reference speaker and the first remote speaker based on the second time and a second distance between the reference speaker and the second remote speaker based on the third time are determined. For example, using the second time and the third time derived in step 304, measurement determiner 216 is configured to determine the first distance and the second distance.

Referring again to FIG. 4, the first distance and the second distance of step 306 are illustrated. For example, the first distance may correspond to a distance dtxr1 402, and the second distance may correspond to a distance dtxr2 404. As noted with respect to FIG. 1, wireless audio source 104 may cause reference speaker 110 to playback the known sweep signal at a first time (t1). Knowing the start time of playback (e.g., t1) by the reference speaker (e.g., via prior communications between wireless audio source 104, first speaker 102a, and second speaker 102b) and the received times of the sweep signal by first speaker 102a, and second speaker 102b (e.g., times t2 for each speaker), the distance between first speaker 102a and wireless audio source 104 (dtxr1) and the distance between second speaker 102b and wireless audio source 104 (dtxr2) can be calculated by measurement determiner 216 from the time difference, according to:

$$(t2-t1)=D/Vs \quad \text{(Equation 1)}$$

$$D=(t2-t1)*Vs \quad \text{(Equation 2)}$$

where Vs is the velocity of sound: for D=dtxr1 which is the first distance between first speaker 102a and wireless audio source 104 where t2 is the time the sweep is received for first speaker 102a—and for D=dtxr2 which is the second distance between second speaker 102b and wireless audio source 104 where t2 is the time the sweep is received for second speaker 102b. Times t2 may be provided to measurement determiner by first speaker 102a and second speaker 102b via wireless signals 116.

By repetitive distance measurements, a better estimate may be obtained. In embodiments, multiple calculations based on multiple playbacks of the sweep signal may be performed.

If wireless audio source 104 is connected to reference speaker 110 (either as a stand-alone speaker or in display device 114) via a wired connection such as HDMI or any other wired means, zero propagation delay may be assumed and playback timing is as per timer/clock 214 of wireless audio source 104; hence, in effect, display device 114, reference speaker 110, and wireless audio source 104 can be assumed to be time-synchronized.

In step 308, a calibration of at least one of the first remote speaker or the second remote speaker for the acoustic space is performed based on the first distance and the second distance. For instance, calibrator 218 of system 200 may be configured to perform calibration functions/operations for the first remote speaker and/or the second remote speaker based on the first and second distances (dtxr1, dtxr2) determined in step 306. Calibrator 218 and calibration functions/operations are discussed in further detail below in FIGS. 6-9.

B. Measurement of Distance—Phase 2

The description for the second phase for measurement of distances continues from Subsection II.A above and is provided in the context of FIGS. 1-4 as described above, and FIG. 5 described in this Subsection.

Figure 5:
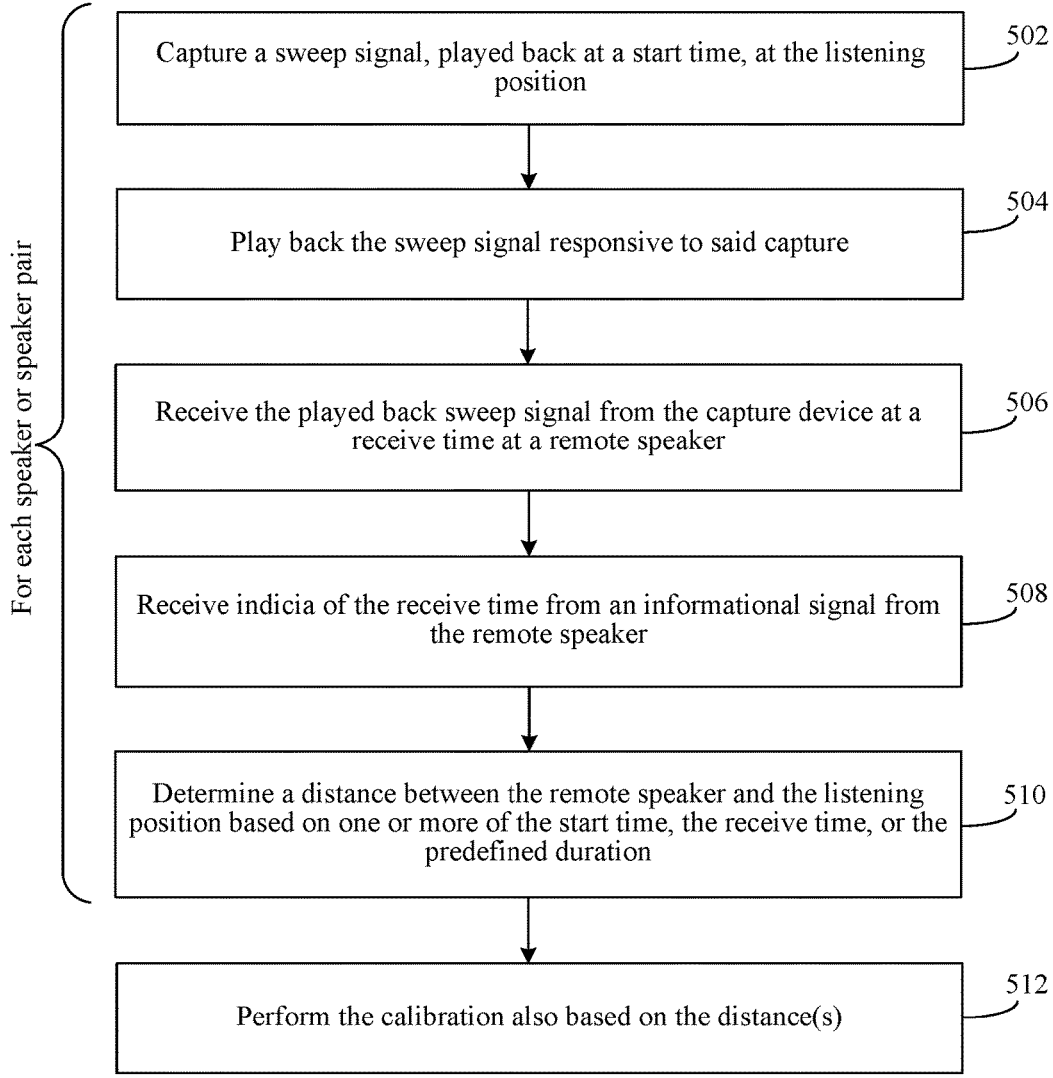
FIG. 5 shows a flowchart for determining distances and angles between speakers and other home theater components and calibrating wireless speakers, according to an example embodiment.

FIG. 5 shows a flowchart 500 for determining distances and angles between speakers and other home theater components and calibrating wireless speakers, according to an example embodiment. System 200 and location controller 208 may operate according to flowchart 500, in an embodiment. Further structural and operational examples will be apparent to persons skilled in the relevant art(s) based on the following description. Flowchart 500 is described as follows.

Flowchart 500 begins at step 502. In step 502, the sweep signal, played back at a start time, is captured at the listening position. During the second phase for measurement of distances, the known sweep signal is again played back. For example, referring to FIG. 1, in embodiments the sweep signal is again played back via a speaker (e.g., first speaker Rx1 102a, second speaker Rx2 102b, or reference speaker 110) at a first time t1 of the second phase (which may be performed for each remote speaker). In one example, sound generator 212 of wireless audio source 104 may cause the sweep signal to be played back by first speaker Rx1 102a and/or second speaker Rx2 102b by providing the sweep signal thereto via communicator 210 and network interface 222 and via wireless signals 116.

In some embodiments, one of first speaker Rx1 102a or second speaker Rx2 102b may play back the sweep signal according to step 502 to be followed by the other of first speaker Rx1 102a or second speaker Rx2 102b playing back the sweep signal. In other embodiments, steps of flowchart 500 may be performed first for one speaker and then for the other speaker.

The sweep signal is captured by capture device Cx 112 at listening position Lp in step 502. Capture device Cx 112 is configured to have a microphone such as microphone 226 shown in FIG. 2 to capture sweep signals.

In some embodiments, the sweep signal is again played back in step 502 via reference speaker 110 for a capture and additional playback by capture device Cx 112 twice for determining the third and fourth distances below.

In step 504, the sweep signal is played back responsive to said capture. For instance, as noted in step 502, capture device Cx 112 captures the sweep signal at the listening position Lp—at the end of the sweep signal duration for the capture, capture device Cx 112 plays back the sweep signal from its own speaker at the listening position Lp in step 504. Capture device Cx 112 is configured to have a speaker such as speaker 224 shown in FIG. 2 to play back sweep signals.

In step 506, the played back sweep signal is received from the capture device at a receive time at a remote speaker. For example, the sweep signal played back by capture device Cx 112 in step 504 may be received by the same speaker that played back the sweep signal at the start time (e.g., first speaker Rx1 102a or second speaker Rx2 102b). The initiating time of this played back sweep signal (e.g., t2) received by the speaker may be registered (e.g., stored) in a memory as described herein.

In step 508, indicia of the receive time from an informational signal from the remote speaker are received. For instance, location controller 208 is configured to receive a signal with indicia of the receive time (e.g., corresponding to when first speaker 102a or second speaker 102b received the played back sweep signal from capture device 112 in step 506) from a remote speaker via network interface 222 and communicator 210. That is, when the sweep signal is played back as in step 506, speakers of the systems described herein are configured to receive the played back sweep signal via microphones, register the times when the signal is received (e.g., using timer/clock 214), and then report back the received time, e.g., to location controller 208 for calculations. Thus, both the first speaker and the second wireless speaker in-turn capture the sweep signal. In the context of FIG. 1, the indicia of time may be received by a location controller 208 of audio source 104.

In step 510, a distance between the remote speaker and the listening position is determined based on one or more of the start time, the receive time, or the predefined duration. For example, measurement determiner 216 may be configured to determine the distance. That is, where the receive time is t2, and the start time is t1, the difference value (t2-t1) encompasses twice the propagation delay from the speaker to the listening position/capture device as well as the sweep duration. As an example, taking first speaker 102a, the difference value and distance dcxr1 406 between the first speaker 102a and the capture device 112 at the listening position Lp may be calculated in accordance with Equations 3 and 4, which are shown below:

$$(t2-t1) = ((2*D)/Vs) + tsweep \quad \text{(Equation 3)}$$

$$D = ((t2-t1) - tsweep)*(Vs/2) \quad \text{(Equation 4)}$$

where D=dcxr1, tsweep is the known sweep duration, and Vs is the velocity of sound.

The above-described procedure may be performed for each wireless speaker in turn. For example, with reference to FIG. 1, the above-described procedure may be performed for second speaker 102b to obtain distance dcxr2 408 between the second speaker 102b and capture device 112 at the listening position Lp (i.e., D=dcxr2). That is, the preceding steps of flowchart 500 may be performed for each speaker or speaker pair in a system, such as those described herein, according to embodiments.

In step 512, the calibration is performed also based on the distance(s). For instance, calibrator 218 of system 200 may be configured to perform calibration functions/operations for the first remote speaker and/or the second remote speaker also based on third and fourth distances (e.g., distances dcxr1 406 and dcxr2 408 of FIG. 4) determined according to step 510 (in addition to the first and second distances (e.g., distances dtxr1 402 and dtxr2 404) determined in step 306 and utilized in step 308 of flowchart 300 in FIG. 3). Calibrator 218 and calibration functions/operations are discussed in further detail below in FIGS. 6-9.

Referring again to FIG. 4, additional distances in system 400 may be determined. For example, a distance dtxcx 410 between capture device 112 at the listening position Lp and wireless audio source 104 may also be obtained. This distance may be obtained through geometrical calculations, which make use of the distance between a chosen pair of wireless speakers (e.g., a distance dr1r2 412 between first speaker 102a and second speaker 102b), the distance between each speaker and the listening position (e.g., distance dtxr1 402 and distance dtxr2 404 described above), and the distance between each wireless speaker and the listening position (e.g., distances dcxr1 406 and dcxr2 408 described above). The latter two set of distances ((dtxr1, dtxr2) and (dcxr1, dcxr2)) are obtained from the earlier steps of flowchart 300 and flowchart 500. The distance between speakers (e.g., distance dr1r2 412 between first speaker 102a and second speaker 102b) may be obtained similarly to the procedure performed during the first phase as described above by playing back the sweep signal from one speaker (e.g., one of first speaker 102a or second speaker 102b) at a known time instance and captured at the other wireless speaker (e.g., the other one of first speaker 102a or second speaker 102b).

C. Measurement of Angles

The description for angle determinations and measurements distances continues from Subsections II.A-B above and is provided in the context of system 400 of FIG. 4 as described above. Additionally, it should be noted that measurement determiner 216 of FIG. 2 may be configured to perform any or all of the angle measurements in this Subsection.

For instance, given the above sets of distance values, the angles between the horizontal axis connecting first speaker 102a and second speaker 102b and having distance dr1r2 412, and the axes (previously characterized by their respective distance values) connecting any one of the wireless speakers to capture device Cx 112 and/or wireless audio source 104 are obtained. An angle 'a1' 418 may be determined from a dtxr1 axis, a dtxr2 axis, and a dr1r2 axis, and an angle 'a2' 420 may be determined from a dcxr1 axis, a dcxr2 axis, and the dr1r2 axis. The cumulative angle 'a' 416 (i.e., angle a1 418+angle a2 420) between the axes connecting second speaker 102b to the capture device Cx 112 at the listening position Lp (the dcxr2 axis) and the display device (the dtxr2 axis), along with the distances between second speaker 102b and wireless audio source 104 (distance dtxr2 404) and second speaker 102b and capture device Cx 112 (distance dcxr2 408), may then be used to find the distance between capture device Cx 112 and wireless audio source 104 (distance dtxcx 410) using simple geometrical principles.

After performing the calculations described above for distances, angle calculations may be performed by constructing appropriate triangles out of all the distance measurements with the dtxcx axis as one side, and then applying the law of cosines to calculate the angles of all wireless receivers subtended at the listening position (e.g., an angle ar1Lp 422 and an angle ar2Lp 424) with respect to the dtxcx axis.

In accordance with an embodiment, angle calculations may be performed as follows. With reference to FIG. 4, consider the triangle formed by wireless audio source 104 (Tx), first speaker 102a (Rx1), and capture device 112 (Cx) at the listening position (Lp). As per the cosine rule, angle ar1Lp 422 may be calculated in accordance with Equations 5 and 6, which are shown below. Equation 6 may be obtained by applying the inverse cosine to Equation 5.

$$(dtxr1)^2 = (dtxcx)^2 + (dcxr1)^2 - (2*(dtxcx)*(dcxr1)*\cos(ar1Lp)) \quad \text{(Equation 5)}$$

$$\text{angle } ar1Lp = \cos^{-1}(((dtxcx)^2 + (dcxr1)^2 - (dtxr1)^2)/(2*(dtxcx)*(dcxr1))) \quad \text{(Equation 6)}$$

Angle ar2Lp 424 may be calculated in accordance with Equations 7 and 8, which are shown below. Equation 8 may be obtained by applying the inverse cosine to Equation 7.

$$(dtxr2)^2 = (dtxcx)^2 + (dcxr2)^2 - (2*(dtxcx)*(dcxr2)*\cos(ar2Lp)) \quad \text{(Equation 7)}$$

$$\text{angle } ar2Lp = \cos^{-1}(((dtxcx)^2 + (dcxr2)^2 - (dtxr2)^2)/(2*(dtxcx)*(dcxr2))) \quad \text{(Equation 8)}$$

Accordingly, each angle and distance between the speakers and components of system 400 of FIG. 4 may be determined, and thus locations of the speakers and components may be accurately determined and mapped.

D. Resolving Left/Right Ambiguity of Speaker Positions

Left/right ambiguity of the wireless speaker positions (i.e., ambiguity between first speaker 102a and second speaker 102b being to the left or right of the listening position) can be resolved by performing another iteration of the above-described procedures in Sections II.A-C with capture device Cx 112 at the listening position being shifted to the right and/or left. The variations in distances from the two measurement cycles and the knowledge of the shift direction of the listening position/capture device provides the necessary information to resolve any ambiguity.

E. Calibration and Room Equalization (EQ)

The measurement embodiments described above in this Section provide for necessary information to perform calibration operations, including room equalization (EQ), for speakers of audio systems in non-optimal placements.

Figure 6:
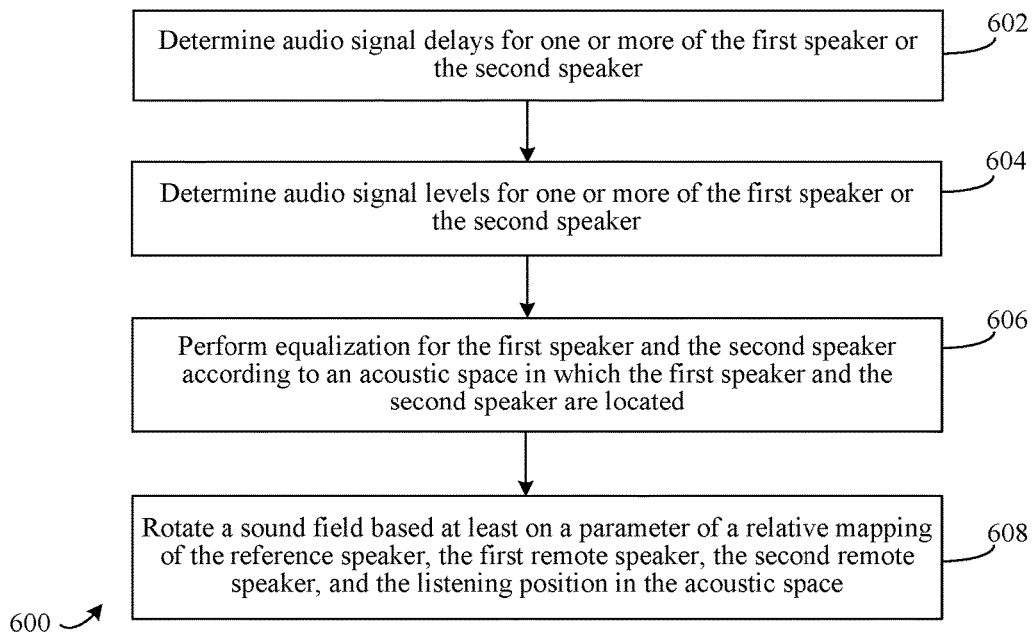
FIG. 6 shows a flowchart for determining distances and angles between speakers and other home theater components and calibrating wireless speakers, according to an example embodiment.

Referring now to FIG. 6, a flowchart 600 for determining distances and angles between speakers and other home theater components and calibrating wireless speakers is shown, according to an example embodiment. System 200 and calibrator 218 (and audio signal processor 220) may operate according to flowchart 600, in an embodiment. Further structural and operational examples will be apparent to persons skilled in the relevant art(s) based on the following description. One or more of the steps of flowchart 600 may be performed for each speaker or speaker pair of a given system. Flowchart 600 may be a further embodiment of step 308 of flowchart 300 in FIG. 3 and/or of step 512 of flowchart 500 in FIG. 5. Flowchart 600 is described as follows.

Flowchart 600 begins with step 602. In step 602, audio signal delays are determined for one or more of the first speaker or the second speaker. For example, calibrator 218 (and audio signal processor 220 in embodiments) may be configured to determine audio signal delays for speakers based on relative distances of speakers with respect to other speakers, relative distances of speakers with respect to an audio source, times of flight for wireless signals to speakers, distances or times of flight for propagation of sound from speakers to a listening position, and/or the like. Delays may be determined/generated for the speakers of a system to compensate for differences noted above.

In step 604, audio signal levels are determined for one or more of the first speaker or the second speaker. For instance, calibrator 218 (and audio signal processor 220 in embodiments) may be configured to determine the audio signal levels. For instance, loudness of individual speakers may vary according to placement and to manufacture, and may be determined based on average magnitudes for frequency response. The loudness may be used to match volume levels for all speakers.

In step 606, equalization for the first speaker and the second speaker is performed according to an acoustic space in which the first speaker and the second speaker are located. For example, calibrator 218 (and audio signal processor 220 in embodiments) may be configured to perform the equalization. The equalization may include generation and/or application of an EQ filter for one or more speakers. The equalization is performed according to the acoustic space in which the speakers reside, as well as individual speaker locations (e.g., non-ideal locations) within the acoustic space.

In step 608, a sound field is rotated based at least on a parameter of a relative mapping of the reference speaker, the first remote speaker, the second remote speaker, and the listening position in the acoustic space. For instance, calibrator 218 (and audio signal processor 220 in embodiments) may be configured to determine/apply rotation of sound fields to compensate for non-ideal speaker configurations as described in further detail below in this subsection.

Additional and further details for various steps of flowchart 600 are provided below in this subsection.

In some embodiments, calibration operations may utilize impulse or frequency responses of speakers. For instance, an impulse response from each wireless speaker captured by the capture device(s) at the listening position, as described herein, may be used to calculate the room EQ. Further details regarding this process can be found in aforementioned U.S. Pat. No. 8,588,431.

Figure 7:
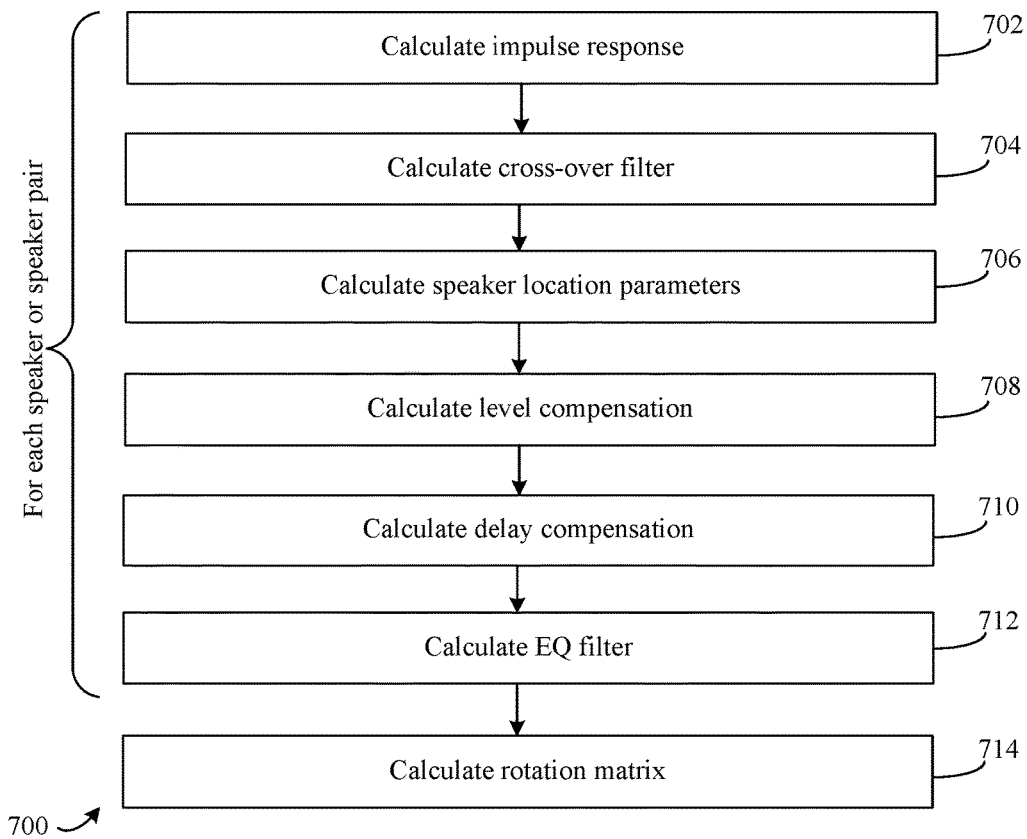
FIG. 7 shows a flowchart for determining distances and angles between speakers and other home theater components and calibrating wireless speakers, according to an example embodiment.

Referring now to FIG. 7, a flowchart 700 for determining distances and angles between speakers and other home theater components and calibrating wireless speakers is shown, according to an example embodiment. System 200 and calibrator 218 (and audio signal processor 220) may operate according to flowchart 700, in an embodiment. Further structural and operational examples will be apparent to persons skilled in the relevant art(s) based on the following description. One or more of the steps of flowchart 700 may be performed for each speaker or speaker pair of a given system. Flowchart 700 may be a further embodiment of step 308 of flowchart 300 in FIG. 3 and/or of step 512 of flowchart 500 in FIG. 5, and/or of flowchart 600 in FIG. 6. Flowchart 700 is described as follows.

System 200 and calibrator 218 (including audio signal processor 220) may perform a calculation of design parameters to enable rotation of a multi-channel sound field to simulate ideal channel placement for an audio system having non-ideal speaker placement(s). One or more audio signals such as the sweep/calibration signal are broadcast/played back through a speaker(s) as described herein (a "calibration audio signal"). The played back sweep signals may be received through a microphone(s) such as those of a capture device(s) (e.g., capture device Cx 112) positioned at a listening position. The received signals may be provided to system 200 and calibrator 218 (including audio signal processor 220) for the calculations and steps of flowchart 700. Flowchart 700 begins at step 702.

In step 702, an impulse response for the broadcast calibration audio signal is calculated, e.g., by taking the inverse Fourier transform (FFT) of the ratio of the FFT of the frequency sweep signal and FFT of the received microphone signal for a given speaker playback of the sweep signal.

In step 704, a cross-over ("Xover") filter is calculated that is a fourth order Butterworth filter whose cut-off frequency is determined from the frequency response of the previously calculated impulse response. For instance, the point at which the amplitude of the frequency response drops to −10 dB of the maximum amplitude over the entire frequency range may be taken as the cut-off frequency. A 4th order low pass coefficient and a 4th order Butterworth high pass filter coefficient may then be calculated.

In step 706, using the microphone(s) of capture device Cx 112 described above, a subject speaker angle and height may be calculated in relation to the listening position. More particularly, using the impulse response of each microphone, between every pair of microphones, the time difference (Δt) between the peak amplitude of the impulse responses is first calculated. The time difference (Δt) is utilized to give the angle of incidence of the sound direction. For example, a time difference (Δt) of zero seconds indicates that the sound arrived at both subject microphones in the pair simultaneously, and so the source is placed in the hyper-plane that is equidistant from both microphones.

Similarly, a time difference (Δt) which is equal to the time taken by sound to cover the distance between the two microphones indicates that the source of the sound is in the straight line that joins the two subject microphones. The angle of the incoming sound with respect to the line joining the two microphones is calculated as the inverse cosign of the ratio Δt to the time taken by sound to traverse the distance between the two subject microphones. Each such angle represents a possible hyper-plane in which the subject speaker broadcasting the calibration signal can lie with respect to the subject pair of microphones. The physical location of the subject speaker in relation to the listening location is localized using data from the plurality of such microphone pairs. The physical location that gives the minimum error to all the calculated hyper-planes is taken as the location of the broadcasting speaker. Using the Cartesian coordinate of the broadcast sound source, the subject speaker's angle in the horizontal plane with respect to front and the height is calculated.

In step 708, responsive to receipt of the calibration signal broadcast through the subject speaker, the loudness of the subject speaker is determined to calculate level compensation by computing the average of the magnitude of all the frequency responses for the subject speaker. The inverse of this is utilized to match the volume of each subsequent speaker.

In step 710, a delay compensation is calculated by first calculating the delay between broadcast of the calibration signal and receipt of such signal at to the microphone, e.g., through examination of the point at which the impulse repulse is at its maximum. This delay is then subtracted from the pre-determined maximum delay allowed by the system and used as a delay compensation factor.

In step 712, an EQ filter is calculated for the subject speaker for later compensation of any uneven frequency response of the previously determined impulse response. The impulse response is first passed through a set of all-pass filters to mimic the non-linear frequency scale of a human auditory system. The magnitude (m) of this modified impulse response is then calculated using FFT. A finite impulse response (FIR), 'iw', is computed which is the minimum phase filter whose magnitude response is inverse of 'm'. The FIR iw is then passed through a set of all-pass filters which inverts the non-linear mapping to yield the final EQ filter.

In step 714, a rotation matrix is calculated using speaker angle and height data determined above.

Figure 8:
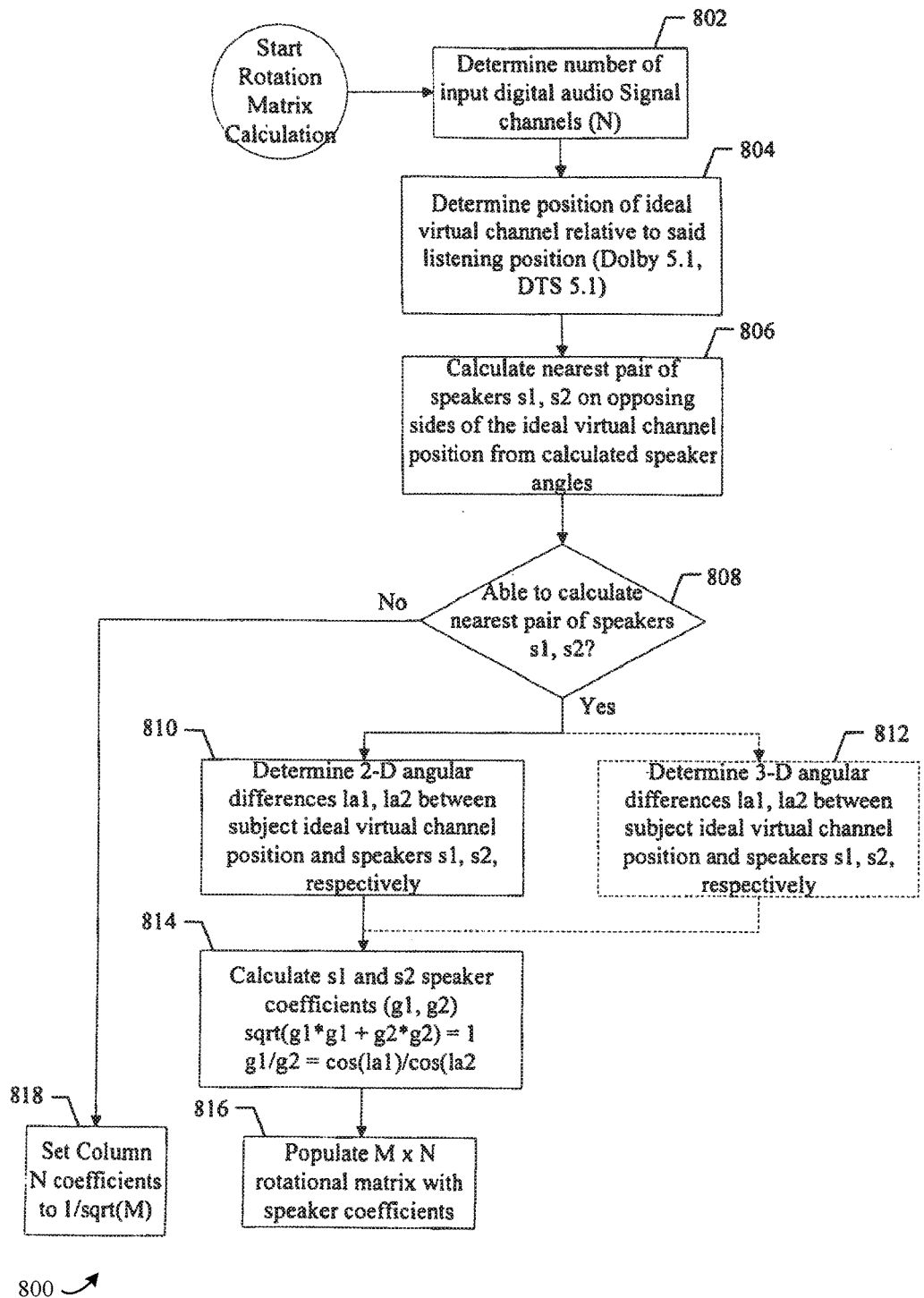
FIG. 8 shows a flowchart for determining distances and angles between speakers and other home theater components and calibrating wireless speakers, according to an example embodiment.

Referring now to FIG. 8, a flowchart 800 is shown for an embodiment of a design of a rotation matrix for rotation of a multi-channel sound field.

In step 802, the number of input digital audio signal channels is determined. In step 804, associated positions of ideal virtual channels are determined relative to the listening position. For example, a Dolby 5.1 or DTS 5.1 System may be defined by left and right front speakers located on opposing sides and 1.5 meters from a center channel. Left and right surround speakers would be located on opposing sides of a listening position and also spaced approximately 1.5 meters from such a listening position.

In step 806, responsive to capture of the broadcast calibration audio signal in all microphones, the nearest pair of speakers s1 and s2 on opposing sides of the subject ideal virtual channel position are calculated from the calculate speaker angles. If the system is successful at calculating the nearest pair of speakers in step 808, then the angular differences between speakers s1 and s2 and the subject ideal virtual channel position are determined (Ia1 and Ia2, respectively) in step 810. For example, first speaker 102a and reference speaker 110 (which may be a center channel speaker) might represent speakers s1 and s2, respectively. Angles Ia1 and Ia2, representing the angular difference between speakers s1 and s2 and the subject ideal virtual channel position, respectively, may be determined.

In an alternative embodiment for an audio system that is capable of determining speaker locations in three dimensions, the 3-D angular differences (Ia1, Ia2) between speakers s1 and s2 and their respective ideal virtual channel positions may be determined in step 812.

Speaker coefficients g1 and g2 are calculated for speakers s1 and s2, respectively, for the 2-D relationship, illustrated in step 814 according to Equation 9 and Equation 10 below:

$$\mathrm{sqrt}(g1*g1+g2*g2)=1 \quad \text{(Equation 9)}$$

$$g1/g2=\cos(Ia1)/\cos(Ia2) \quad \text{(Equation 10)}$$

In step 816, the M×N rotational matrix is populated with the determined speaker coefficients.

If the audio system is unable to calculate the nearest pair of speakers s1 and s2 according to the above description (e.g., in step 808), then column N for the subject ideal channel of the M×N rotational matrix may be populated with coefficients set to 1/sqrt(M) to evenly distribute the digital audio input amplitude across the subject speakers (as in step 818).

Figure 9:
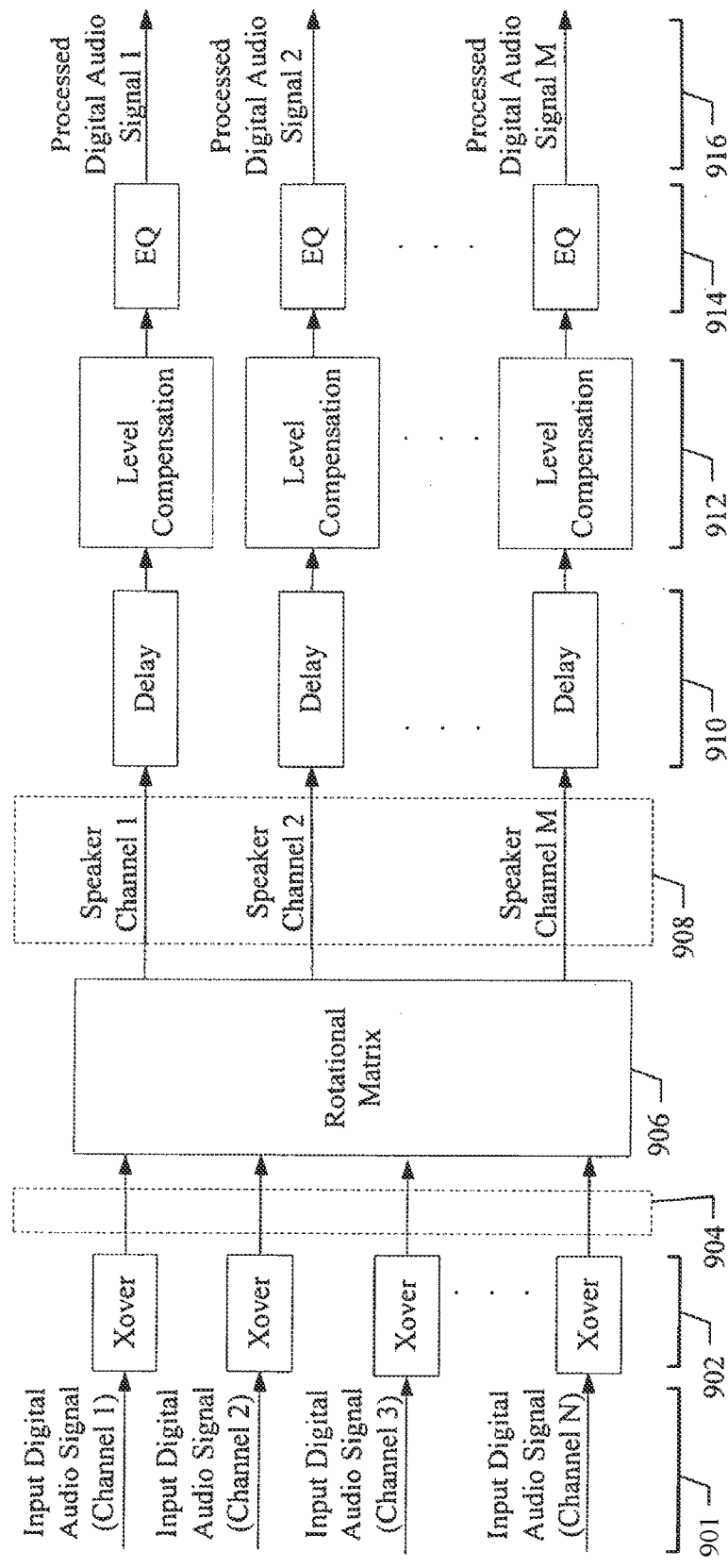
FIG. 9 shows a flow diagram of a system for calibrating wireless speakers, according to an example embodiment.

In one embodiment using the rotation matrix illustrated in FIG. 8, FIG. 9 shows a flow diagram 900 illustrating the use of design parameters to rotate a sound field for simulation of ideal channel placement in an audio system having non-ideal speaker placement. The input digital audio signal channels (N) of the digital audio sample 901 are passed through respective cross-over filters 902 to form on input audio channel amplitude vector 904. Input audio channel amplitude vector 904 is multiplied with a rotational matrix 906 (as described in the flow diagram of FIG. 8) to generate a virtual output speaker channel amplitude vector 908. Speaker channels 1 through 'M' are, in a 2-D embodiment of rotational matrix 906, then introduced through further audio compensation/calibration filters, such as respective delay compensation blocks 910, level compensation blocks 912 and EQ filters 914, for the resulting processed digital audio signals 1 through M 916 to be amplified and broadcast through respective speaker channels.

In an alternative embodiment that is configured for a 3-D rotational matrix (not shown for the sake of brevity), delay compensation blocks 910 may be omitted as a result of the three-dimensional and angular difference calculations that would be available for each speaker channel 1 through M without further delayed compensation.

III. Example Mobile Device and Computer System Implementations

Embodiments described herein may be implemented in hardware, or hardware combined with software and/or firmware. For example, embodiments described herein may be implemented as computer program code/instructions configured to be executed in one or more processors and stored in a computer readable storage medium. Alternatively, embodiments described herein may be implemented as hardware logic/electrical circuitry.

As noted herein, the embodiments described herein, including system 100 of FIG. 1, system 200 of FIG. 2, system 400 of FIG. 4, along with any components and/or subcomponents thereof, as well as the flowcharts/flow diagrams described herein and/or further examples described herein, may be implemented in hardware, or hardware with any combination of software and/or firmware, including being implemented as computer program code configured to be executed in one or more processors and stored in a computer readable storage medium, or being implemented as hardware logic/electrical circuitry, such as being implemented together in a system-on-chip (SoC), a field programmable gate array (FPGA), a digital signal processor (DSP), or an application specific integrated circuit (ASIC). A SoC may include an integrated circuit chip that includes one or more of a processor (e.g., a microcontroller, microprocessor, DSP, etc.), memory, one or more communication interfaces, and/or further circuits and/or embedded firmware to perform its functions.

Embodiments described herein may be implemented in one or more computing devices similar to a mobile system and/or a computing device in stationary or mobile computer embodiments, including one or more features of mobile systems and/or computing devices described herein, as well as alternative features. The descriptions of mobile systems and computing devices provided herein are provided for purposes of illustration, and are not intended to be limiting. Embodiments may be implemented in further types of computer systems, as would be known to persons skilled in the relevant art(s).

Figure 10:
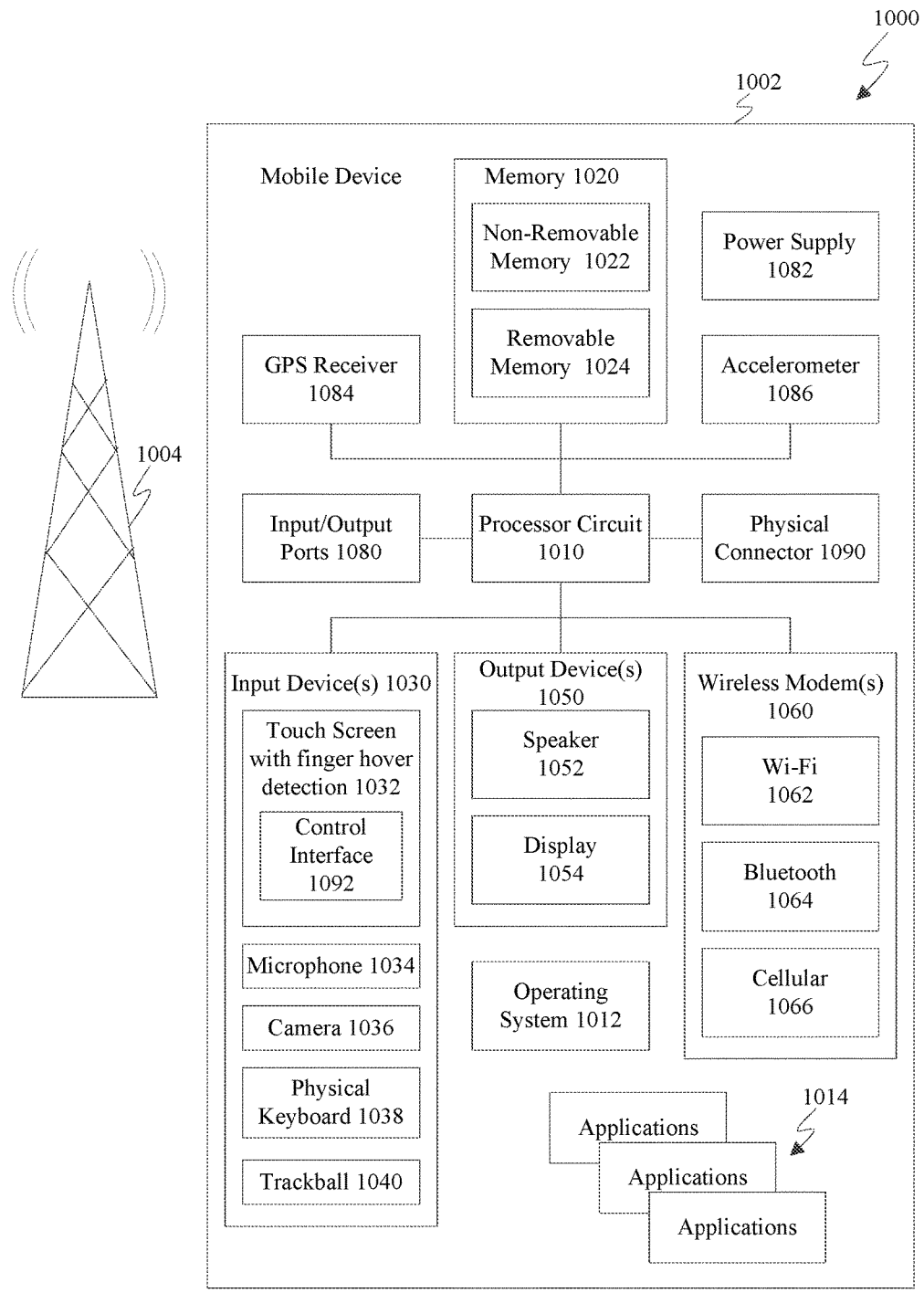
FIG. 10 shows a block diagram of an example mobile device that may be used to implement various example embodiments.

FIG. 10 is a block diagram of an exemplary mobile system 1000 that includes a mobile device 1002 that may implement embodiments described herein. For example, mobile device 1002 may be used to implement any system, client, or device, or components/subcomponents thereof, in the preceding sections. As shown in FIG. 10, mobile device 1002 includes a variety of optional hardware and software components. Any component in mobile device 1002 can communicate with any other component, although not all connections are shown for ease of illustration. Mobile device 1002 can be any of a variety of computing devices (e.g., cell phone, smart phone, handheld computer, Personal Digital Assistant (PDA), etc.) and can allow wireless two-way communications with one or more mobile communications networks 1004, such as a cellular or satellite network, or with a local area or wide area network.

Mobile device 1002 can include a controller or processor 1010 (e.g., signal processor, microprocessor, ASIC, or other control and processing logic circuitry) for performing such tasks as signal coding, data processing, input/output processing, power control, and/or other functions. An operating system 1012 can control the allocation and usage of the components of mobile device 1002 and provide support for one or more application programs 1014 (also referred to as "applications" or "apps"). Application programs 1014 may include common mobile computing applications (e.g., e-mail applications, calendars, contact managers, web browsers, messaging applications) and any other computing applications (e.g., word processing applications, mapping applications, media player applications).

Mobile device 1002 can include memory 1020. Memory 1020 can include non-removable memory 1022 and/or removable memory 1024. Non-removable memory 1022 can include RAM, ROM, flash memory, a hard disk, or other well-known memory devices or technologies. Removable memory 1024 can include flash memory or a Subscriber Identity Module (SIM) card, which is well known in GSM communication systems, or other well-known memory devices or technologies, such as "smart cards." Memory 1020 can be used for storing data and/or code for running operating system 1012 and application programs 1014. Example data can include web pages, text, images, sound files, video data, or other data to be sent to and/or received from one or more network servers or other devices via one or more wired or wireless networks. Memory 1020 can be used to store a subscriber identifier, such as an International Mobile Subscriber Identity (IMSI), and an equipment identifier, such as an International Mobile Equipment Identifier (IMEI). Such identifiers can be transmitted to a network server to identify users and equipment.

A number of programs may be stored in memory 1020. These programs include operating system 1012, one or more application programs 1014, and other program modules and program data. Examples of such application programs or program modules may include, for example, computer program logic (e.g., computer program code or instructions) for implementing one or more of system 100 of FIG. 1, system 200 of FIG. 2, system 400 of FIG. 4, along with any components and/or subcomponents thereof, as well as the flowcharts/flow diagrams described herein and/or further examples described herein.

Mobile device 1002 can support one or more input devices 1030, such as a touch screen 1032, a microphone 1034, a camera 1036, a physical keyboard 1038 and/or a trackball 1040 and one or more output devices 1050, such as a speaker 1052 and a display 1054. Other possible output devices (not shown) can include piezoelectric or other haptic output devices. Some devices can serve more than one input/output function. For example, touch screen 1032 and display 1054 can be combined in a single input/output device. Input devices 1030 can include a Natural User Interface (NUI).

Wireless modem(s) 1060 can be coupled to antenna(s) (not shown) and can support two-way communications between processor 1010 and external devices, as is well understood in the art. Modem(s) 1060 are shown generically and can include a cellular modem 1066 for communicating with the mobile communication network 1004 and/or other radio-based modems (e.g., Bluetooth 1064 and/or Wi-Fi 1062). At least one of wireless modem(s) 1060 is typically configured for communication with one or more cellular networks, such as a GSM network for data and voice communications within a single cellular network, between cellular networks, or between the mobile device and a public switched telephone network (PSTN).

Mobile device 1002 can further include at least one input/output port 1080, a power supply 1082, a satellite navigation system receiver 1084, such as a Global Positioning System (GPS) receiver, an accelerometer 1086, and/or a physical connector 1090, which can be a USB port, IEEE 1394 (FireWire) port, and/or RS-232 port. The illustrated components of mobile device 1002 are not required or all-inclusive, as any components can be deleted and other components can be added as would be recognized by one skilled in the art.

In an embodiment, mobile device 1002 is configured to implement any of the above-described features of flowcharts herein. Computer program logic for performing any of the operations, steps, and/or functions described herein may be stored in memory 1020 and executed by processor 1010.

Figure 11:
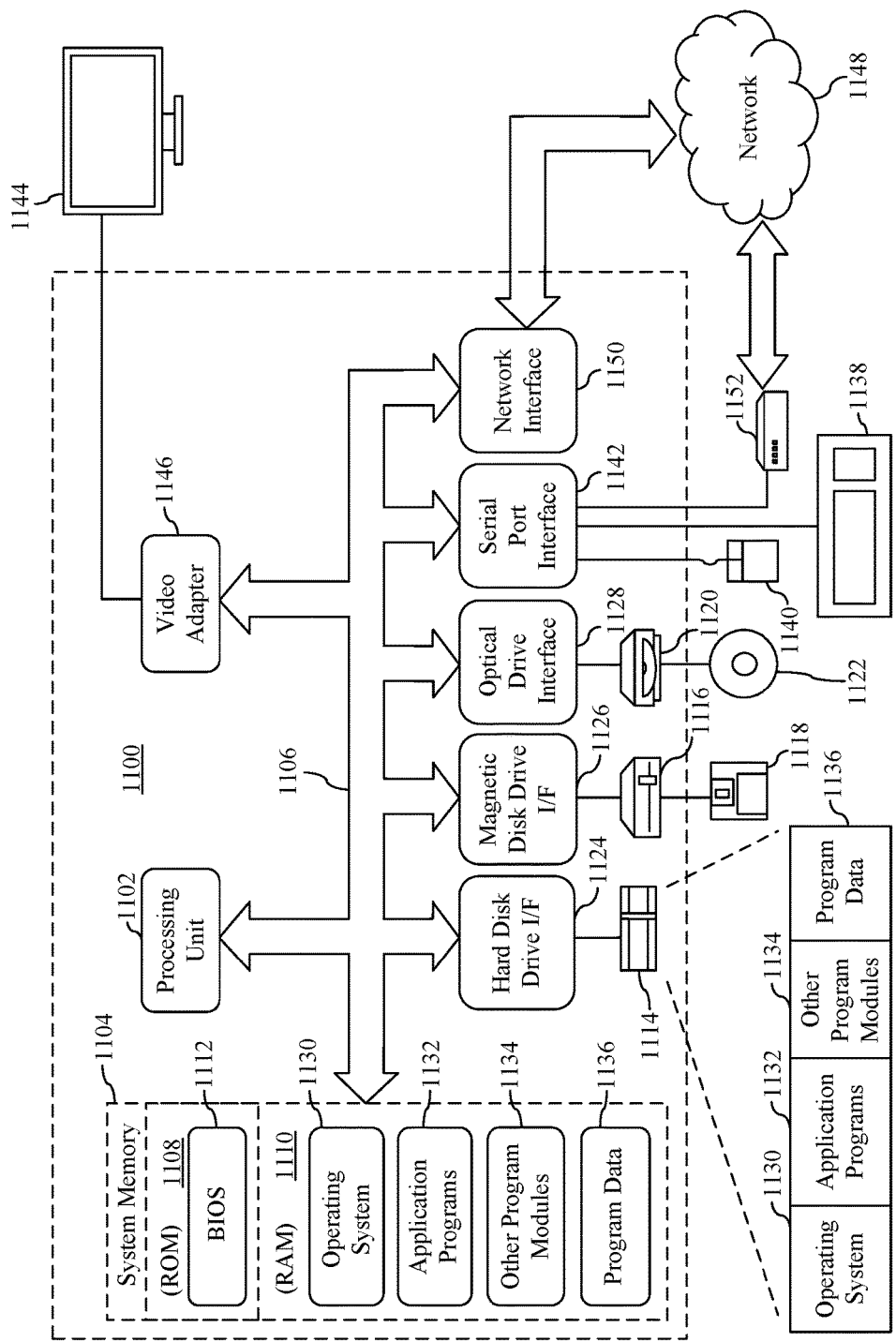
FIG. 11 shows a block diagram of an example computing device that may be used to implement embodiments.

FIG. 11 depicts an exemplary implementation of a computing device 1100 in which embodiments may be implemented. For example, embodiments described herein may be implemented in one or more computing devices similar to computing device 1100 in stationary or mobile computer embodiments, including one or more features of computing device 1100 and/or alternative features. The description of computing device 1100 provided herein is provided for purposes of illustration, and is not intended to be limiting. Embodiments may be implemented in further types of computer systems, as would be known to persons skilled in the relevant art(s).

As shown in FIG. 11, computing device 1100 includes one or more processors, referred to as processor circuit 1102, a system memory 1104, and a bus 1106 that couples various system components including system memory 1104 to processor circuit 1102. Processor circuit 1102 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor circuit 1102 may execute program code stored in a computer readable medium, such as program code of operating system 1130, application programs 1132, other programs 1134, etc. Bus 1106 represents one or more of any of several types of bus structures, including a memory bus or memory controller, a peripheral bus, an accelerated graphics port, and a processor or local bus using any of a variety of bus architectures. System memory 1104 includes read only memory (ROM) 1108 and random access memory (RAM) 1110. A basic input/output system 1112 (BIOS) is stored in ROM 1108.

Computing device 1100 also has one or more of the following drives: a hard disk drive 1114 for reading from and writing to a hard disk, a magnetic disk drive 1116 for reading from or writing to a removable magnetic disk 1118, and an optical disk drive 1120 for reading from or writing to a removable optical disk 1122 such as a CD ROM, DVD ROM, or other optical media. Hard disk drive 1114, magnetic disk drive 1116, and optical disk drive 1120 are connected to bus 1106 by a hard disk drive interface 1124, a magnetic disk drive interface 1126, and an optical drive interface 1128, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMs, ROMs, and other hardware storage media.

A number of program modules may be stored on the hard disk, magnetic disk, optical disk, ROM, or RAM. These programs include operating system 1130, one or more application programs 1132, other programs 1134, and program data 1136. Application programs 1132 or other programs 1134 may include, for example, computer program logic (e.g., computer program code or instructions) for implementing embodiments described herein, such as system 100 of FIG. 1, system 200 of FIG. 2, system 400 of FIG. 4, along with any components and/or subcomponents thereof, as well as the flowcharts/flow diagrams described herein and/or further examples described herein.

A user may enter commands and information into the computing device 1100 through input devices such as keyboard 1138 and pointing device 1140. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor circuit 1102 through a serial port interface 1142 that is coupled to bus 1106, but may be connected by other interfaces, such as a parallel port, game port, or a universal serial bus (USB).

A display screen 1144 is also connected to bus 1106 via an interface, such as a video adapter 1146. Display screen 1144 may be external to, or incorporated in computing device 1100. Display screen 1144 may display information, as well as being a user interface for receiving user commands and/or other information (e.g., by touch, finger gestures, virtual keyboard, etc.). In addition to display screen 1144, computing device 1100 may include other peripheral output devices (not shown) such as speakers and printers.

Computing device 1100 is connected to a network 1148 (e.g., the Internet) through an adaptor or network interface 1150, a modem 1152, or other means for establishing communications over the network. Modem 1152, which may be internal or external, may be connected to bus 1106 via serial port interface 1142, as shown in FIG. 11, or may be connected to bus 1106 using another interface type, including a parallel interface.

As used herein, the terms "computer program medium," "computer-readable medium," and "computer-readable storage medium" are used to refer to physical hardware media such as the hard disk associated with hard disk drive 1114, removable magnetic disk 1118, removable optical disk 1122, other physical hardware media such as RAMs, ROMs, flash memory cards, digital video disks, zip disks, MEMs, nano-technology-based storage devices, and further types of physical/tangible hardware storage media (including memory 1120 of FIG. 11). Such computer-readable media and/or storage media are distinguished from and non-overlapping with communication media and propagating signals (do not include communication media and propagating signals). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media that are separate and non-overlapping with embodiments directed to computer-readable storage media.

As noted above, computer programs and modules (including application programs 1132 and other programs 1134) may be stored on the hard disk, magnetic disk, optical disk, ROM, RAM, or other hardware storage medium. Such computer programs may also be received via network interface 1150, serial port interface 1142, or any other interface type. Such computer programs, when executed or loaded by an application, enable computing device 1100 to implement features of embodiments discussed herein. Accordingly, such computer programs represent controllers of the computing device 1100.

Embodiments are also directed to computer program products comprising computer code or instructions stored on any computer-readable medium. Such computer program products include hard disk drives, optical disk drives, memory device packages, portable memory sticks, memory cards, and other types of physical storage hardware.

It is noted that while FIG. 11 shows a "computer," persons skilled in the relevant art(s) would understand that embodiments/features described herein could also be implemented using other well-known processor-based computing devices, including but not limited to, tablet computers, netbooks, gaming consoles, personal media players, and the like.

The embodiments described herein, including systems, methods/processes, and/or apparatuses, may be implemented using well known computing devices, such as computer 1100 shown in FIG. 11. For example, display device (TV), wireless audio source (Tx), capture device (Cx) and/or elements of speakers Rx1 and/or Rx2, and each of the steps of flowchart 200 depicted in FIG. 2 and/or flowchart 300 depicted in FIG. 3 can each be implemented using one or more computers 1100.

IV. Additional Examples and Advantages

As described, systems and devices embodying the techniques herein may be configured and enabled in various ways to perform their respective functions. In embodiments, one or more of the steps or operations of any flowchart and/or flow diagram described herein may not be performed. Moreover, steps or operations in addition to or in lieu of those in any flowchart and/or flow diagram described herein may be performed. Further, in examples, one or more operations of any flowchart and/or flow diagram described herein may be performed out of order, in an alternate sequence, or partially (or completely) concurrently with each other or with other operations.

The additional examples, embodiments, etc., described in this Section may be applicable to examples disclosed in any other Section or subsection of this disclosure.

The embodiments and techniques herein provide for improvements in home entertainment, audio system setup, and audio system operation. The described embodiments and techniques provide for maximizing audio quality in systems with non-optimal speaker placements. That is, even when optimal placement of speakers for an audio system is not possible, e.g., due to room limitations, the embodiments and techniques allow for automatic determinations of speaker locations (e.g., via distance and angle measurements for speakers, as described above) to perform calibration operations for audio systems and speakers to maximize a user's listening experience.

V. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A method for determining a distance between two or more speakers and a reference speaker co-located with an audio source device, and calibration thereof, the method comprising:

playing back a sweep signal from the reference speaker at a first time;

receiving the played back sweep signal by a first microphone of a first speaker of the two or more speakers at a second time;

receiving the played back sweep signal by a second microphone of a second speaker of the two or more speakers at a third time;

determining a first distance between the first speaker and the audio source device based on the first time and the second time;

determining a second distance between the second speaker and the audio source device based on the first time and the third time;

capturing the played back sweep signal by a capture device located at a listening position at a fourth time, and in response, playing back the sweep signal from the capture device, wherein a third distance is between the first speaker and the listening position, and a fourth distance is between the second speaker and the listening position, receiving the sweep signal from the capture device by the first speaker at a fifth time, and determining the third distance based on one or more of the fourth time, the fifth time, and a duration of the sweep signal;

capturing the played back sweep signal by the capture device located at the listening position at a sixth time, and in response, playing back the sweep signal from the capture device, receiving the sweep signal played back from the capture device by the second speaker at a seventh time, and determining the fourth distance based on at least one of the sixth time, the seventh time, and the duration of the sweep signal; and calibrating at least one of the first speaker or the second speaker based on the first distance, the second distance, the third distance, and the fourth distance.

2. The method of claim 1, further comprising:
determining a first angle formed with respect to:
an axis connecting the listening position and the reference speaker at the audio source device, and
the first speaker; and
determining a second angle formed with respect to:
the axis, and
the second speaker.

3. The method of claim 2, wherein the first angle is determined in accordance with the following equation:

$$ar1Lp = \cos^{-1}(((dtxcx)^2 + (dcxr1)^2 - (dtxr1)^2)/(2*(dtxcx)*(dcxr1)))$$

where,
dcxr1 corresponds to the third distance,
dtxcx corresponds to the axis,
dtxr1 corresponds to the first distance, and
ar1Lp corresponds to the first angle.

4. The method of claim 2, wherein the second angle is determined in accordance with the following equation:

$$ar2Lp = \cos^{-1}(((dtxcx)^2 + (dcxr2)^2 - (dtxr2)^2)/(2*(dtxcx)*(dcxr2)))$$

where,
dcxr1 corresponds to the fourth distance,
dtxcx corresponds to the axis,
dtxr1 corresponds to the second distance, and
ar2Lp corresponds to the second angle.

5. The method of claim 1, wherein calibrating further comprises at least one of:

determining audio signal delays for one or more of the first speaker or the second speaker;
determining audio signal levels for one or more of the first speaker or the second speaker; or
performing equalization for the first speaker and the second speaker according to an acoustic space in which the first speaker and the second speaker are located.

6. The method of claim 1, wherein the reference speaker is part of a display device located at the audio source device.

7. A system for determining speaker distances and performing speaker calibration in an acoustic space, the system comprising a reference speaker, a controller, and a calibrator;
the controller being configured to:
cause the reference speaker to playback a sweep signal at a first time, the sweep signal having a predefined duration;
receive indicia of a second time from a first informational signal from a first remote speaker and indicia of a third time from a second informational signal from a second remote speaker;
determine a first distance between the reference speaker and the first remote speaker based on the second time and a second distance between the reference speaker and the second remote speaker based on the third time;
cause the sweep signal to be played back at a fourth time by the first remote speaker, wherein a third distance is between the first speaker and a listening position, and a fourth distance is between the second speaker and the listening position,
receive indicia of a fifth time from a third informational signal from the first remote speaker where the fifth time relates to receipt of the sweep signal, provided from a capture device at the listening position responsive to capture of the sweep signal played back at the fourth time, by the first remote speaker,
cause the sweep signal to be played back at a sixth time by the second remote speaker,
receive indicia of a seventh time from a fourth informational signal from the second remote speaker where the seventh time relates to receipt of the sweep signal, provided from the capture device at the listening position responsive to capture of the sweep signal played back at the sixth time, by the second remote speaker, and
determine the third distance based on the fifth time and the fourth distance based on the seventh time; and
the calibrator being configured to:
perform a calibration of at least one of the first remote speaker or the second remote speaker for the acoustic space based on the first distance, the second distance, the third distance, and the fourth distance.

8. The system of claim 7, further comprising the first remote speaker, the second remote speaker, and the capture device;
the capture device being configured to:
capture the sweep signal played back at a fourth time and at the sixth time at the listening position, and
play back the sweep signal responsive to said capture;
the first remote speaker being configured to:
receive the sweep signal played back from the capture device at the fifth time;
the second speaker being configured to:
receive the sweep signal played back from the capture device at the seventh time; and
the controller being further configured to:
determine the third distance and the fourth distance also based on the predefined duration.

9. The system of claim 8, wherein the first remote speaker is configured to receive the played back sweep signal via a first microphone thereof;
wherein the second remote speaker is configured to receive the played back sweep signal via a second microphone thereof; and
wherein the capture device is configured to:
capture the played back sweep signal via a capture microphone thereof, and
play back the sweep signal via a capture speaker thereof.

10. The system of claim 7, wherein the calibrator is configured to perform the calibration that includes at least one of:
to determine audio signal delays for one or more of the first speaker or the second speaker;
to determine audio signal levels for one or more of the first speaker or the second speaker; or
to perform equalization for the first speaker and the second speaker according to an acoustic space in which the first speaker and the second speaker are located.

11. The system of claim 7, wherein the controller is configured to generate a relative mapping of the reference speaker, the first remote speaker, the second remote speaker, and the listening position in the acoustic space; and
wherein the calibrator is configured to perform the calibration that includes to rotate a sound field with respect to the listening position based at least on a parameter of the relative mapping.

12. The system of claim 7, the system comprising one or more of the first remote speaker, the second remote speaker, or the capture device; and
wherein the one or more of the first remote speaker, the second remote speaker, or the capture device comprise the controller.

13. A computer readable storage medium having program instructions recorded thereon that, when executed by a processor, perform a method for determining a distance between two or more speakers and a reference speaker co-located with an audio source device, and calibration thereof, the method comprising:
playing back a sweep signal from the reference speaker at a first time;
receiving the played back sweep signal by a first microphone of a first speaker of the two or more speakers at a second time;
receiving the played back sweep signal by a second microphone of a second speaker of the two or more speakers at a third time;
determining a first distance between the first speaker and the audio source device based on the first time and the second time;
determining a second distance between the second speaker and the audio source device based on the first time and the third time;
capturing the played back sweep signal by a capture device located at a listening position at a fourth time, and in response, playing back the sweep signal from the capture device, wherein a third distance is between the first speaker and the listening position, and a fourth distance is between the second speaker and the listening position,
receiving the sweep signal from the capture device by the first speaker at a fifth time, and determining the third distance based on one or more of the fourth time, the fifth time, and a duration of the sweep signal;

capturing the played back sweep signal by the capture device located at the listening position at a sixth time, and in response, playing back the sweep signal from the capture device, receiving the sweep signal played back from the capture device by the second speaker at a seventh time, and determining the fourth distance based on at least one of the sixth time, the seventh time, and the duration of the sweep signal; and calibrating at least one of the first speaker or the second speaker based on the first distance, the second distance, the third distance, and the fourth distance.

14. The computer readable storage medium of claim 13, wherein the method further comprises:

determining a first angle formed with respect to:
an axis connecting the listening position and the reference speaker at the audio source device, and
the first speaker; and determining a second angle formed with respect to:
the axis, and
the second speaker.

15. The computer readable storage medium of claim 14, wherein the first angle is determined in accordance with the following equation:

$$ar1Lp = \cos^{-1}(((dtxcx)^2 + (dcxr1)^2 - (dtxr1)^2)/(2*(dtxcx)*(dcxr1)))$$

where,
dcxr1 corresponds to the third distance,
dtxcx corresponds to the first axis,
dtxr1 corresponds to the first distance, and
ar1Lp corresponds to the first angle.

16. The computer readable storage medium of claim 14, wherein the second angle is determined in accordance with the following equation:

$$ar2Lp = \cos^{-1}(((dtxcx)^2 + (dcxr2)^2 - (dtxr2)^2)/(2*(dtxcx)*(dcxr2)))$$

where,
dcxr1 corresponds to the fourth distance,
dtxcx corresponds to the first axis,
dtxr1 corresponds to the second distance, and
ar2Lp corresponds to the second angle.

17. The computer readable storage medium of claim 13, wherein the calibrating comprises at least one of:

determining audio signal delays for one or more of the first speaker or the second speaker;

determining audio signal levels for one or more of the first speaker or the second speaker;

performing equalization for the first speaker and the second speaker according to an acoustic space in which the first speaker and the second speaker are located; or rotating a sound field with respect to the listening position based at least on a parameter of a relative mapping for the first speaker and the second speaker in the acoustic space.

* * * * *